United States Patent [19]

Eaton, Jr. et al.

[11] Patent Number: 4,491,936
[45] Date of Patent: Jan. 1, 1985

[54] DYNAMIC RANDOM ACCESS MEMORY CELL WITH INCREASED SIGNAL MARGIN

[75] Inventors: Sargent S. Eaton, Jr., Colorado Springs, Colo.; Robert J. Proebsting, Plano, Tex.

[73] Assignee: Mostek Corporation, Carrollton, Tex.

[21] Appl. No.: 346,605

[22] Filed: Feb. 8, 1982

[51] Int. Cl.³ .................... G11C 11/40; G11C 11/24
[52] U.S. Cl. .................................................. 365/149
[58] Field of Search .................... 365/149, 189, 203

[56] References Cited

U.S. PATENT DOCUMENTS 4,409,672 10/1983 Takemae ........................... 365/149

Primary Examiner—Joseph A. Popek

[57] ABSTRACT

A dynamic random access memory cell (30) includes an access transistor (32) having the gate terminal thereof connected to a word line (34) and the source and drain terminals thereof connected between a bit line (36) and a node (37). A charge storage capacitor (38) is connected between the node (37) and a decoded plate line (40). The plate line (40) receives a bi-level voltage which shifts levels in a timing sequence keyed to the word line (34) signal. Shifting of voltage levels provided to the capacitor (38) through the plate line (40) essentially doubles the signal margin of the memory circuit (30) to thereby enhance the reliability of the data stored in the memory circuit (30).

2 Claims, 3 Drawing Figures

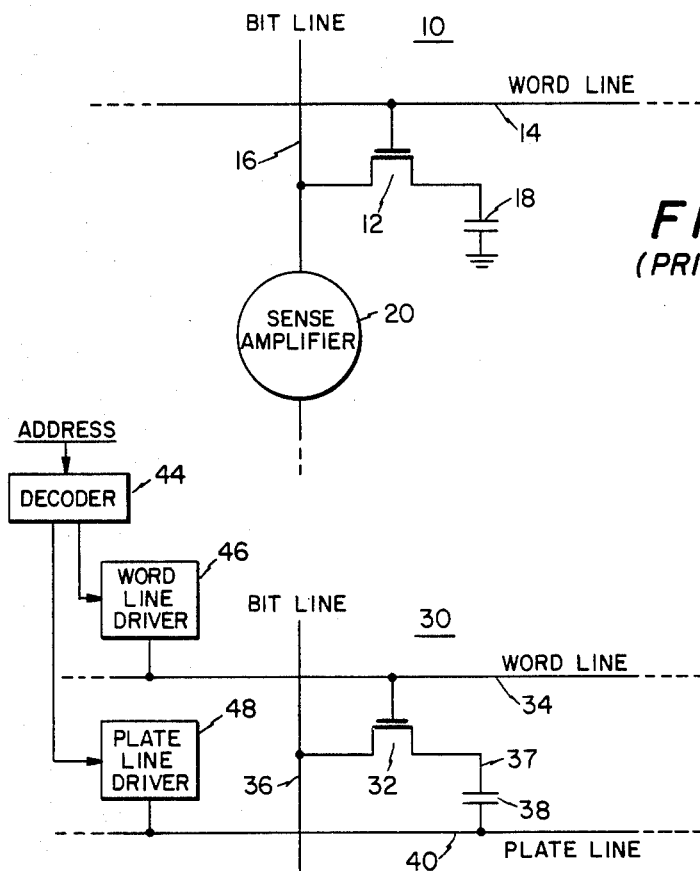
FIG. 1
(PRIOR ART)
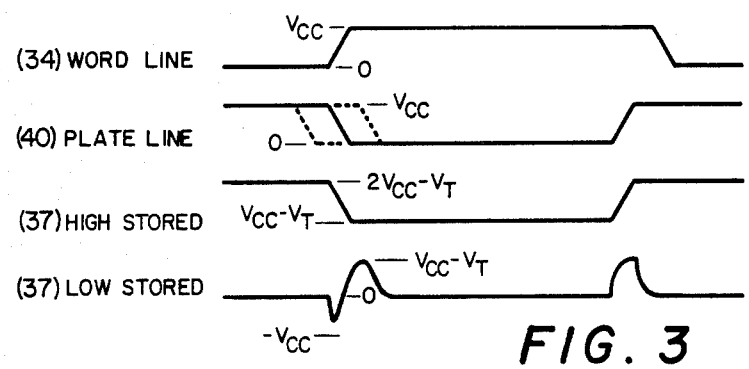
FIG. 2
FIG. 3

DYNAMIC RANDOM ACCESS MEMORY CELL WITH INCREASED SIGNAL MARGIN

TECHNICAL FIELD

The present invention pertains to semiconductor memories and in particular to a one transistor dynamic random access memory cell.

BACKGROUND OF INVENTION

Dynamic random access memories have come into widespread use for digital data storage due to the small cell size and resulting high density. The current trends in dynamic memory circuit development are toward lower supply voltages and smaller storage capacitors. However, these design trends lead to a reduction in the signal margin between high and low voltage states which are read from the storage capacitor. As the signal margin becomes smaller there is a greater probability that the data will be in error.

In view of the importance of signal margin in dynamic random access memories there exists a need for a method and apparatus for increasing the signal margin without significantly increasing the complexity and size of the memory circuit.

SUMMARY OF INVENTION

A selected embodiment of the present invention is a dynamic random access memory cell which has an enhanced signal margin. The memory cell includes an access transistor which has gate, source and drain terminals. A storage capacitor has a first terminal thereof connected to a first of the source and drain terminals of the access transistor. A bit line is connected to a second of the source and drain terminals of the access transistor. A word line is connected to the gate terminal of the transistor wherein the word line is activated in response to an address signal which selects the memory cell. A plate line is connected to a second terminal of the capacitor wherein the plate line is activated by the same address signal which is provided to activate the word line.

BRIEF DESCRIPTION OF DRAWINGS

For a more complete understanding of the present invention and the advantages thereof, reference is now made to the following description taken in conjunction with the accompanying drawings in which:

FIG. 1 is a schematic illustration of a conventional one transistor dynamic memory cell;

FIG. 2 is a schematic illustration of a one transistor memory cell in accordance with the present invention; and FIG. 3 is an illustration of waveforms for signals in the circuit shown in FIG. 2.

DETAILED DESCRIPTION

Referring now to FIG. 1 there is illustrated a conventional single transistor dynamic random access memory cell 10. The cell 10 is replicated in an array of rows and columns to form a large memory matrix. An access transistor 12 has the gate terminal thereof connected to a word line 14 which is activated in response to a specific memory address. The source and drain terminals of transistor 12 are connected between a bit line 16 and a first terminal of a capacitor 18. The second terminal of capacitor 18 is tied to a fixed potential, typically ground, or to a supply voltage terminal.

The bit line 16 is connected to a sense amplifier 20 which serves to detect a small voltage change on bit line 16 due to the voltage state which has previously been stored on the capacitor 18.

The supply voltage for a memory circuit is typically termed $V_{cc}$. The threshold voltage for a transistor is typically termed $V_T$. In the operation of memory cell 10, a high voltge state is stored on capacitor 18 by applying the supply voltage $V_{cc}$ to lines 14 and 16. This results in the voltage $V_{cc}-V_T$ on capacitor 18. A low voltage state is applied to capacitor 18 by receiving the supply $V_{cc}$ on the word line 14 and a zero volt level on the bit line 16. This results in the storage of a zero voltage level on capacitor 18. Since there is zero voltage on the capacitor 18 in the low voltage condition, the difference in stored voltage between the high and low states is $V_{cc}-V_T$.

The memory cell of the present invention is illustrated in FIG. 2 and is designated by the reference numeral 30. The memory cell 30 includes an access transistor 32 which has the gate terminal thereof connected to a word line 34. The source and drain terminals of transistor 32 are connected between a bit line 36 and a node 37 which is connected to a first terminal of a capacitor 38. A second terminal of capacitor 38 is connected to a plate line 40. The bit line 36 is connected to a sense amplifier 42 which serves to detect the small voltage change on bit line 36 due to the voltage state stored on the capacitor 38.

An address signal is provided to a decoder 44 which selectively activates a word line driver 46 and a plate line driver 48. The word line driver 46 activates word line 34 when an address signal is received by decoder 44 to select memory cell 30. Likewise, the plate line driver 48 activates the plate line 40 when an address signal is received by the decoder 44 to select memory cell 30.

Waveforms which represent signals for the circuit 30 shown in FIG. 2 are illustrated in FIG. 3. These are the signals provided to the word line 34 and the plate line 40 and for the node 37 in the conditions having a high and low voltage stored on capacitor 38. The signals for the word line 34 and the plate line 40 are decoded from an address signal which is provided to a memory circuit that includes the memory cell 30. The signals for the word line 34 and plate line 40, which are decoded from an address signal, can be generated by well-known clock circuits. Note that the voltage excursions for these signals are the power supply voltage $V_{cc}$ and ground. All unselected word lines remain at ground while all unselected plate lines remain at $V_{cc}$.

Operation of the circuit of the present invention is now described in reference to FIGS. 2 and 3. The first operation described is the writing and reading of the high voltage state to the capacitor 38. This is followed by a description of writing and reading a low voltage state to the capacitor 38.

To write a high voltage state, the word line 34 and bit line 36 are driven to $V_{cc}$. The plate line 40 is initially at $V_{cc}$ but transitions to ground. This transition can occur at an earlier or later time, relative to the word line transition, as shown by the dotted lines. Node 37 is driven to $V_{cc}-V_T$. When the plate line 40 transitions from zero to $V_{cc}$ the node 37 is driven to approximately $2V_{cc}-V_T$. Note that transistor 32 is off at this time because the gate, line 34, and source, line 36, are both at the same voltage $V_{cc}$. This level is maintained when the word line 34 is brought to ground.

In reading memory cell 30 the bit line 36 is driven to a predetermined voltage state after which the bit line 36 is permitted to float. After the bit line 36 is permitted to float, the word line 34 is driven to a high state and the plate line 40 is driven to a low state. When the plate line 40 transitions from $V_{cc}$ to the zero state the voltage at node 37 is coupled by capacitor 38 down to $V_{cc}-V_T$. When word line 34 goes up to $V_{cc}$, the gate of transistor 32 is driven to $V_{cc}$ but the transistor 32 remains off since the gate is not more than one $V_T$ above the voltage at bit line 36 and node 37. Thus, there is no charge transfer between node 37 and bit line 36 for reading a high state. This operation occurs as described no matter what the order of initial transitions of the word line and plate line. The cell in FIG. 1 likewise has no charge transfer for reading the high state.

For writing a low voltage state the bit line 36 is pulled to ground and the word line 34 is driven to $V_{cc}$. While the plate line 40 is at zero volts, node 37 is discharged to ground. When the plate line 40 transitions from zero to $V_{cc}$ capacitor 38 through coupling attempts to drive the voltage at node 37 positive. However, any charge at node 37 is routed through the conductive transistor 32 to the bit line 36. Thus, node 37 returns to ground potential. After the plate line has gone to $V_{cc}$ and after node 37 has discharged to ground, the word line 34 goes to ground trapping zero volts on node 37.

The read operation for a low voltage state stored on capacitor 38 is carried out as follows. Between cycles the bit line 36 is precharged to a predetermined voltage state and then permitted to float. The plate line is driven from $V_{cc}$ to ground. The negative transition of the plate line 40 from $V_{cc}$ to ground causes capacitor 38 to try to couple node 37 from its initial stored ground level to a $-V_{cc}$ potential. When the word line is driven to positive $V_{cc}$ and the plate line 40 is at ground, charge is then transferred from the bit line 36 to node 37. This charge transfer increases the voltage at node 37. If bit line 36 had been precharged to $V_{cc}$, charge is transferred to node 37 to bring it from approximately $-V_{cc}$ to approximately $V_{cc}-V_T$. This charge transfer to node 37 accordingly lowers the voltage at the bit line 36. This reduction in voltage at bit line 36 is detected by sense amplifier 42 to determine the data state stored on capacitor 38. The reading of a low voltage state on capacitor 38 results in node 37 being pulled to ground by operation of sense amplifier 42.

This method of reading a low voltage state is in contrast to the prior art shown in FIG. 1 in which only enough charge is transferred from the bit line 16 to the terminal of capacitor 18 for bringing the voltage on capacitor 18 from ground to $V_{cc}-V_T$. Thus, in the present invention the reading of a zero results in more than twice the charge transfer out of the bit line than in the prior art while the reading of a high level is the same in both cases. Therefore, the signal available for detection by the sense amplifier is more than doubled for the present invention. This substantial increase in signal margin between high and low stored voltage states serves to increase the probability that the correct high and low voltage states will be read from the memory cell 30.

In a particular application of the memory cell 30, $V_{cc}$ is $+5.0$ volts relative to 0.0 volts ground and $V_T$ is approximately 1.0 volts. Transistor 32 is an N-channel, enhancement device.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

We claim:

1. A method of operation for a dynamic semiconductor memory cell, comprising the steps of:

floating a bit line at a predetermined voltage state;

driving a selected word line from a first voltage state to a second voltage state, said word line connected to the gate terminal of an access transistor;

driving a selected plate line from said second voltage state to said first voltage state prior to the time of driving said selected word line from a first voltage state to a high voltage state, said plate line connected to a first terminal of a capacitor, the drain and source terminals of said transistor connected between said bit line and a second terminal of said capacitor;

sensing the voltage level on said bit line after word line has been driven to said second voltage state and said plate line has been driven to said first voltage state;

driving said plate line from said first voltage state to said second voltage state after said step of sensing; and driving said word line from said second voltage state to said first voltage state after said plate line has been driven from said first voltage state to said second voltage state.

2. A method of operation for a dynamic semiconductor memory cell, comprising the steps of:

floating a bit line at a predetermined voltage state;

driving a selected word line from a low voltage state to a high voltage state, said word line connected to the gate terminal of an access transistor having a first terminal thereof connected to said bit line;

driving a selected plate line from said high voltage state to said low voltage state prior to the time of driving said selected word line from a low voltage state to a high voltage state, said plate line connected to a first terminal of a capacitor having a second terminal thereof connected to a second terminal of said access transistor;

sensing the charge transferred from said capacitor to said bit line when said word line is at said high voltage state and said plate line is at said low voltage state;

driving said plate line from said low voltage state to said high voltage state after said step of sensing; and driving said word line from said high voltage state to said low voltage state after said plate line is driven to said high voltage state.

* * * * *